(12) United States Patent
Kim et al.

(10) Patent No.: US 9,101,059 B2
(45) Date of Patent: Aug. 4, 2015

(54) CONDUCTIVE FILM HAVING OXIDE LAYER AND METHOD OF MANUFACTURING THE SAME

(71) Applicant: LG CHEM, LTD., Seoul (KR)

(72) Inventors: Ji Hee Kim, Daejeon (KR); Jung Bum Kim, Daejeon (KR); Jung Hyoung Lee, Daejeon (KR); Min Choon Park, Daejeon (KR)

(73) Assignee: LG Chem, Ltd., Seoul (KR)

( * ) Notice: Subject to any disclaimer, the term of this patent is extended or adjusted under 35 U.S.C. 154(b) by 80 days.

(21) Appl. No.: 13/894,928

(22) Filed: May 15, 2013

(65) Prior Publication Data

US 2013/0248227 A1    Sep. 26, 2013

Related U.S. Application Data

(63) Continuation of application No. PCT/KR2011/008802, filed on Nov. 17, 2011.

(30) Foreign Application Priority Data

Nov. 17, 2010 (KR) .......................... 10-2010-0114642

(51) Int. Cl.
| | | |
|---|---|---|
| H05K 1/02 | (2006.01) | |
| H05K 3/10 | (2006.01) | |
| H01L 31/0224 | (2006.01) | |
| H01L 31/0392 | (2006.01) | |
| H01L 31/18 | (2006.01) | |

(52) U.S. Cl.
CPC ...... *H05K 1/0298* (2013.01); *H01L 31/022425* (2013.01); *H01L 31/022466* (2013.01); *H01L 31/0392* (2013.01); *H01L 31/1884* (2013.01); *H05K 3/10* (2013.01); *G02F 2201/12* (2013.01); *G02F 2201/501* (2013.01); *G02F 2202/16* (2013.01); *Y02E 10/50* (2013.01); *Y10T 29/49155* (2015.01)

(58) Field of Classification Search
CPC ............................... H05K 1/0298; H05K 3/10
USPC .......................................................... 174/255
See application file for complete search history.

(56) References Cited

U.S. PATENT DOCUMENTS

2008/0277147 A1*  11/2008  Mizushima et al. .......... 174/255

FOREIGN PATENT DOCUMENTS

| JP | 52-70751 | | 6/1977 |
|---|---|---|---|
| JP | 07-78786 | A | 3/1995 |
| JP | 2003-162957 | A | 6/2003 |
| JP | 2005-38778 | A | 2/2005 |
| JP | 2008-098169 | | 4/2008 |
| KR | 10-2004-0041657 | | 5/2004 |
| KR | 10-2005-0046576 | | 5/2005 |
| KR | 10-2009-0066245 | A | 6/2009 |
| KR | 10-2010-0008758 | | 1/2010 |
| KR | 10-2010-0008758 | A | 1/2010 |

* cited by examiner

*Primary Examiner* — Jeremy C Norris
(74) *Attorney, Agent, or Firm* — McKenna Long & Aldridge, LLP

(57) ABSTRACT

Provided are a conductive film and a method of manufacturing the same. The conductive film includes a substrate, a first conductive layer formed on the substrate, and a patterned second conductive layer formed on the first conductive layer. Here, oxide layers are formed on top and side surfaces of the second conductive layer. The conductive film may prevent defects of the conductive layer caused by rapid oxidation or damage to the substrate, and increase emission uniformity.

16 Claims, 3 Drawing Sheets

CONDUCTIVE FILM HAVING OXIDE LAYER AND METHOD OF MANUFACTURING THE SAME

CROSS-REFERENCE TO RELATED APPLICATION

This application claims priority to and the benefit of Korean Patent Application No. 2010-0114642, filed Nov. 17, 2010 the disclosure of which is incorporated herein by reference in its entirety.

BACKGROUND

1. Field of the Invention

The present invention relates to a conductive film including a conductive pattern having an oxide layer and a method of manufacturing the same.

2. Discussion of Related Art

Generally, as a conductive film, a conductive glass substrate having an indium oxide thin film on a glass substrate is used. However, the conductive glass substrate has a problem of increasing a surface resistance as an area is increased. When the surface area is increased, voltage drop may partially occur. To prevent the increase in surface resistance, a metal conductive layer may be formed on the conductive glass substrate. However, when the metal conductive layer formed on an electrode is exposed to the air or a high temperature in a processing process, rapid oxidation may occur on a surface of the total conductive layer. When the rapid oxidation occurs on the surface of the metal conductive layer, a surface layer quality becomes non-uniform, and in severe cases, swelling may occur or a short circuit of a device may be induced, thereby degrading performance.

To prevent the rapid surface oxidation, a separate protective layer is formed. However, the formation of the separate protective layer may make the process complicated, and is the cause of increasing a product cost. In addition, when the separate protective layer is stacked, light transmission may be degraded due to internal total reflection occurring at an interface having a multi-layered structure.

SUMMARY OF THE INVENTION

The present invention is directed to a conductive film including a conductive pattern having an oxide layer and a method of manufacturing the same.

In one aspect, a conductive film including a substrate and first and second conductive layers formed on the substrate is provided. Here, oxide layers are formed on a top surface or a side surface of the second conductive layer.

In another aspect, a method of manufacturing a conductive film includes forming first and second conductive layers on a substrate; and forming a patterned second conductive layer having oxide layers formed on top and side surfaces thereof.

BRIEF DESCRIPTION OF THE DRAWINGS

The above and other objects, features and advantages of the present invention will become more apparent to those of ordinary skill in the art by describing in detail embodiments thereof with reference to the adhered drawings, in which.

DETAILED DESCRIPTION OF EMBODIMENTS

Figure 1:
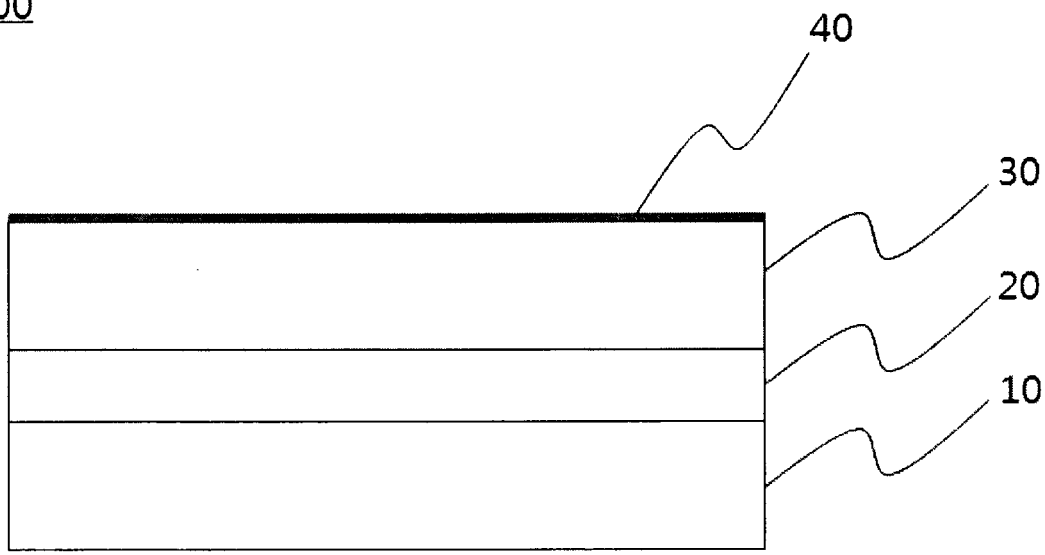
FIG. 1 is a schematic view of a stacked structure of a conductive film according to an embodiment of the present invention.

The present invention provides a conductive film including a substrate and first and second conductive layers formed on the substrate. The conductive film has an oxide layer on a surface of the second conductive layer. The second conductive layer may have a patterned structure. The patterned second conductive layer may serve as a conductive pattern to reduce a surface resistance of the first conductive layer. In addition, the second conductive layer has a structure in which oxide layers are formed on top and side surfaces of the pattern.

The conductive film may be a transparent conductive film through which light is transmitted. Thus, the conductive film may be applied to various display devices and lighting apparatuses requiring light transmission.

When the metal conductive layer is exposed to the air, a native oxide layer may be formed on a surface of the metal conductive layer. However, due to small thickness and low density, the native oxide layer cannot sufficiently protect the conductive layer. For example, in the process of processing the substrate including the metal conductive layer, the metal conductive layer may undergo a high temperature process or may be exposed to an environmental change. Due to such factors, the surface of the conductive layer may be rapidly oxidized. Due to the rapid oxidation, layer quality becomes non-uniform, or a swelling phenomenon is induced, and in severe cases, the substrate may be damaged.

In the present invention, as a separate oxide layer is formed on a surface of the second conductive layer, these problems are solved. Specifically, through thermal or plasma treatment, an oxide layer may be formed on the surface of the second conductive layer. The oxide layer formed on the surface of the second conductive layer may be classified as an artificial oxide layer. The artificial oxide layer may have a larger thickness and a higher density than the native oxide layer.

The substrate may be, but is not limited to, a glass substrate or a light-transmissive plastic film. When the substrate is formed of a light-transmissive film, the substrate may be at least one selected from the group consisting of polyesters, acetates, polyether sulfones, polycarbonates, polyamides, polyimides, (meth)acrylates, polyvinyl chlorides, polyvinylidene chlorides, polystyrenes, polyvinyl alcohols, polyacrylates and polyphenylene sulfides.

The first conductive layer may include ITO or a zinc oxide-based thin film doped with an element M (ZnO:M), and the element M may be a group 13 element or a transition metal having an oxidation number of +3. The element M may include, but is not limited to, boron (B), aluminum (Al), gallium (Ga), indium (In), titanium (Ti), scandium (Sc), vanadium (V), chromium (Cr), manganese (Mn), iron (Fe), cobalt (Co) or nickel (Ni), and preferably Al or Ga.

The second conductive layer may include a conductive material, for example, though not particularly limited to, copper (Cu), Al, molybdenum (Mb), Cr, magnesium (Mg), calcium (Ca), sodium (Na), potassium (K), Ti, In, yttrium (Y), lithium (Li), gadolinium (Gd), silver (Ag), tin (Sn), lead (Pb) or an alloy containing two or more thereof. For example, the second conductive layer may be Cu.

The conductive film may include a separate protective layer formed on the second conductive layer having an oxide layer. The protective layer may include at least one of ITO, IZO and a metal. In addition, when the protective layer is formed of a metal material, the metal may be, but is not limited to, an alkali metal, an alkali earth metal or a mixture or alloy thereof. The protective layer may prevent the damage to the substrate due to the rapid oxidation for the second conductive layer.

The specification of the second conductive layer is not particularly limited, and for example, the second conductive layer may have a thickness of 1 nm to 1 mm. The second conductive layer serves to help the first conductive layer having a relatively large surface resistance to reduce the surface resistance and raise conductivity. The second conductive layer may obtain sufficient electric conductivity in the above-mentioned thickness range. In addition, the second conductive layer has a patterned structure, in which a width of the pattern is 50 nm to 2 µm and a distance between the patterns is 50 µm to 5 mm. When the width of the pattern and distance between the patterns of the second conductive layer are in this range, more excellent emission uniformity may be obtained, while transmission of the first conductive layer, which is a transparent electrode, is not greatly reduced.

The oxide layer formed on the second conductive layer may include $Cu_2O$. The oxide layer including $Cu_2O$ may not degrade a physical property of a conductive film, and may prevent the defects caused by the rapid oxidation of the conductive layer or the damage to the substrate. In addition, the oxide layer formed on the second conductive layer may have a thickness of 1 to 100 nm. In the present invention, the oxide layer formed on the surface of the second conductive layer has a larger thickness and a higher density than the native oxide layer.

In addition, the present invention provides a method of manufacturing a conductive film including a substrate and first and second conductive layers formed on the substrate. Here, an oxide layer is formed on a surface of the second conductive layer.

In an embodiment, the method may include forming first and second conductive layers on a substrate; and forming a patterned second conductive layer having oxide layers formed on top and side surfaces of the conductive layer.

The method may be partially modified according to an order of the patterning of the second conductive layer. That is, the process of patterning the second conductive layer may be performed before or after the process of forming an oxide layer on the second conductive layer.

The method may include forming first and second conductive layers on a substrate, forming an oxide layer on a surface of the second conductive layer, patterning the second conductive layer having the oxide layer, and forming an oxide layer on a side surface of the patterned second conductive layer. In this case, after the oxide layer is formed on the entire surface of the second conductive layer, the patterning process is performed. After the patterning, the process of forming the oxide layer on the side surface of the second conductive layer is performed.

In addition, the method may include forming first and second conductive layers on a substrate, patterning the second conductive layer, and forming oxide layers on top and side surfaces of the patterned second conductive layer. In this case, after the second conductive layer is patterned, the oxide layers are formed on the top and side surfaces of the patterned second conductive layer.

In the process of forming the first and second conductive layers on the substrate, the conductive layers may be sequentially stacked by thermal deposition, vacuum deposition, sputtering, electron beam deposition, ion beam deposition, etc., but the present invention is not limited thereto, and thus any conventional method known in the art will be used.

The process of forming the oxide layer on the second conductive layer may be performed by thermal or plasma treatment. The thermal treatment may be performed at a temperature at which the oxide layer can be formed on the surface of the second conductive layer. For example, the temperature may be, but is not limited to, 130 to 200° C., and preferably 140 to 160° C. In the range of the thermal treatment, deformation of the second conductive layer may be prevented, and the oxide layer may be more stably formed. The plasma treatment may be performed under an oxygen atmosphere to form the oxide layer on the surface of the second conductive layer.

In some cases, after the oxide layer is formed, a subsequent process of applying plasma or heat in an inert gas atmosphere may be further performed.

The conductive film according to the present invention may be applied to various fields, and applicable to display devices or lighting apparatuses. For example, the conductive film may be used in PDAs, notebooks, monitors, OA/FA apparatuses, ATMs, mobile phones, e-paper, navigators, etc., and may also be used in display devices such as an LCD, LED or OLED or lighting apparatuses.

Hereinafter, the present invention will be described in further detail with respect to the drawings according to the present invention, but the scope of the present invention is not limited thereto.

FIG. 1 is a schematic view of a conductive film according to an embodiment of the present invention. Referring to FIG. 1, a conductive film 100 has first and second conductive layers 20 and 30 formed on a substrate 10, and an oxide layer 40 is formed on a surface of the second conductive layer 30. The oxide layer 40 may be formed by oxidizing the surface of the second conductive layer 30 by applying heat or plasma. For example, the substrate 10 is a glass substrate, and the first conductive layer 20 is an ITO layer. In addition, the second conductive layer 30 may include Cu, and have an artificial oxide layer 40 formed on the surface of the second conductive layer 30 by applying heat or plasma. Due to the oxide layer 40, rapid oxidation of the second conductive layer 30 may be prevented, and performance of a device may be maintained.

Figure 2:
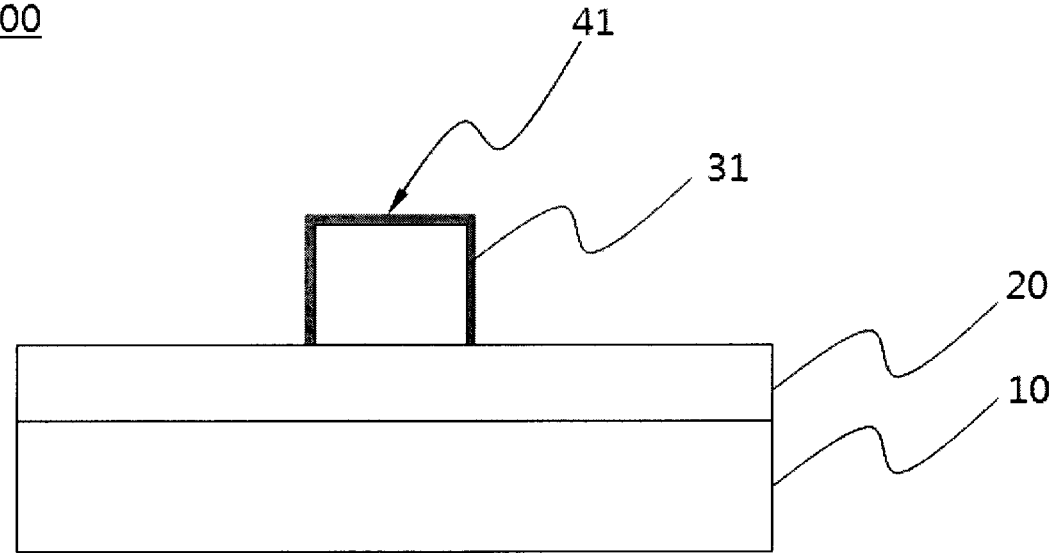
FIG. 2 is a schematic view of a stacked structure of a conductive film according to another embodiment of the present invention.

FIG. 2 is a schematic view showing a second conductive layer patterned by etching the second conductive layer. Referring to FIG. 2, a conductive film 200 has a structure in which a first conductive layer 20 is formed on a substrate 10, and a patterned second conductive layer 31 is formed on the first conductive layer 20. The second conductive layer 31 has oxide layers 41 formed on a side surface of the second conductive layer 31 exposed by etching, in addition to a top surface thereof.

Figure 3:
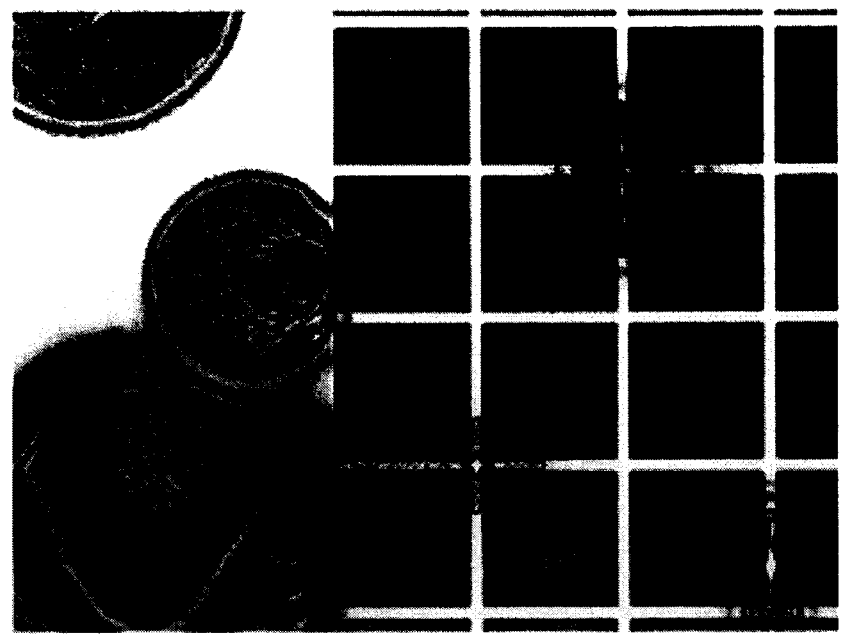
FIG. 3 is an image showing swelling occurring on a patterned metal conductive layer due to rapid oxidation.

FIG. 3 is an image showing a swelling phenomenon occurring in the patterned second conductive layer due to rapid oxidation. When the patterned conductive layer is exposed to a high temperature process for processing the conductive layer, the swelling phenomenon may occur due to the rapid oxidation. Although a separate protective layer is formed on the top surface of the second conductive layer, the side surface of the second conductive layer is exposed in the patterning process, and as the rapid oxidation progresses on the exposed side surface, the non-uniformity of the layer quality and the swelling phenomenon may occur.

Figure 4:
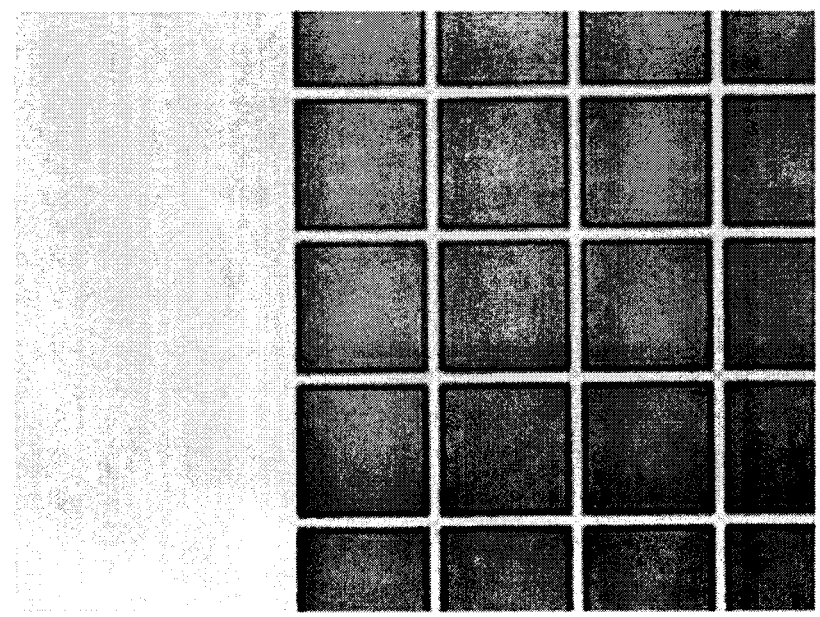
FIG. 4 is an image of a conductive film having a patterned metal conductive layer according to an embodiment of the present invention.

In addition, FIG. 4 is an image of a conductive film including a second conductive layer having an oxide layer according to an embodiment of the present invention. Referring to FIG. 4, the conductive film includes a patterned second conductive layer, and oxide layers are formed on top and side surfaces of the second conductive layer. It is seen that the conductive film shown in FIG. 4 has a uniform layer quality of the conductive layer and does not have a swelling phenomenon unlike that in FIG. 3 subjected to the same high temperature process.

The present invention will be described in further detail with reference to the following Examples. However, these Examples are merely provided to explain the present invention, not to limit the technical scope of the present invention.

EXAMPLE 1

An ITO layer and a Cu layer were sequentially formed on a glass substrate, thereby manufacturing a film having a multi-layered structure. Then, the Cu layer was patterned. A width of the pattern was 1 μm, and a distance between the patterns was 100 μm. An oxide layer ($Cu_2O$) was formed on a surface of the patterned Cu layer by thermally treating the patterned Cu layer at 120° C. for 10 minutes. A thickness of each layer of the manufactured film is shown in Table 1.

EXAMPLE 2

An ITO layer and a Cu layer were sequentially formed on a glass substrate, thereby manufacturing a film having a multi-layered structure. Then, the Cu layer was patterned. A width of the pattern was 1 μm, and a distance between the patterns was 100 μm. An oxide layer ($Cu_2O$) was formed on a surface of the patterned Cu layer by thermally treating the patterned Cu layer at 150° C. for 10 minutes.

EXAMPLE 3

An ITO layer and a Cu layer were sequentially formed on a glass substrate, thereby manufacturing a film having a multi-layered structure, and the film was thermally treated at 150° C. for 10 minutes. Then, the Cu layer was patterned in the structure forming the film. A width of the pattern was 1 μm, and a distance between the patterns was 100 μm. The patterned Cu layer was further thermally treated at 150° C.

COMPARATIVE EXAMPLE

An ITO layer and a Cu layer were sequentially formed on a glass substrate, thereby manufacturing a film having a multi-layered structure. Then, the Cu layer was patterned in the structure forming the film. A width of the pattern was 1 μm, and a distance between the patterns was 100 μm. The manufactured film was not thermally treated.

EXPERIMENTAL EXAMPLE 1

GID Analysis

To analyze data on the oxide layer, grazing incidence diffraction (GID) patterns of the Cu/ITO substrate (Comparative Example) having a native oxide layer formed by exposing the substrate to the air and the $Cu_2O$/Cu/ITO substrate (Example 1) having an oxide layer formed through a treatment process according to the present invention were examined. The examination results are shown in FIG. 5.

Figure 5:
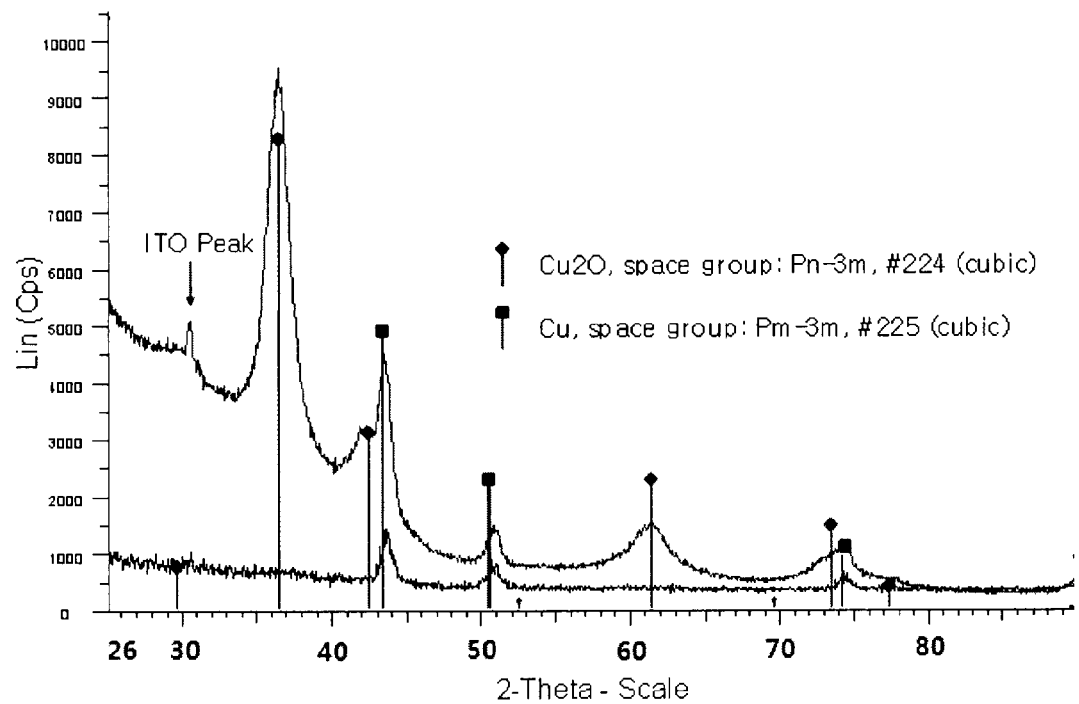
FIG. 5 is a graph comparing and analyzing a GID pattern for a manufactured conductive film.

Referring to FIG. 5, the substrate undergoing the thermal treatment (Example 1) had the $Cu_2O$ layer formed on the patterned copper conductive layer. However, it was seen that the untreated substrate (Comparative Example) had the very thin oxide layer which was barely detected.

EXPERIMENTAL EXAMPLE 2

XRR Analysis

To calculate a thickness of the oxide layer undergoing the thermal treatment, an X-ray reflectometry (XRR) pattern was analyzed. XRR patterns of the Cu/ITO substrate (Comparative Example) having a native oxide layer formed by exposing the substrate to the air and the $Cu_2O$/Cu/ITO substrate (Example 2) having a Cu oxide layer formed through a treatment process according to the present invention were examined. The examination results are shown in FIG. 6.

Figure 6:
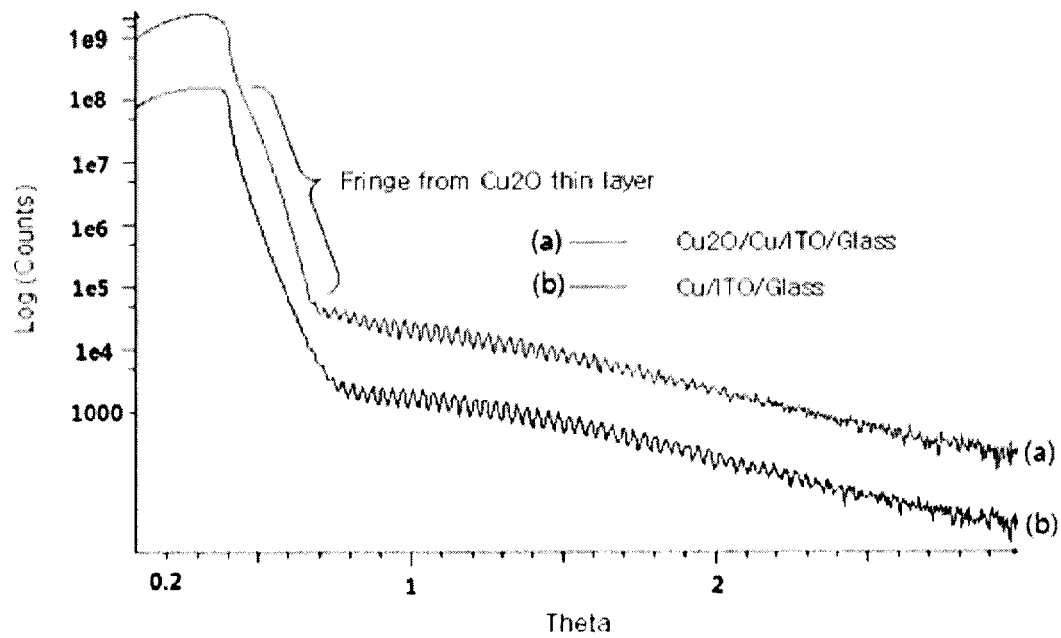
FIG. 6 is a graph comparing and analyzing an XRR pattern for a manufactured conductive film.

Referring to FIG. 6, it was seen that the thermally-treated substrate (Example 2) had the $Cu_2O$ layer having a thickness of approximately 10 nm formed on the surface of the substrate. Thicknesses of the respective layers of the films according to Example 2 and Comparative Example are shown in Tables 1 and 2.

TABLE 1

| Example 2 | Thickness (nm) | | |
|---|---|---|---|
| | Average | Minimum Value | Maximum Value |
| $Cu_2O$ | 10.3 | 10.0 | 10.5 |
| Cu | 364.0 | 354.2 | 388.3 |
| ITO | 121.8 | 120.8 | 123.4 |

TABLE 2

| Comparative | Thickness (nm) | | |
|---|---|---|---|
| Example | Average | Minimum Value | Maximum Value |
| Cu | 363.3 | 353.6 | 374.3 |
| ITO | 122.7 | 122.1 | 123.6 |

As described above, a conductive film according to the present invention can have artificial oxide layers formed on top and side surfaces of a patterned conductive layer, thereby preventing defects caused by rapid oxidation of the conductive layer or damage to a substrate and increasing emission uniformity.

While the invention has been shown and described with reference to certain embodiments thereof, it will be understood by those skilled in the art that various changes in form and details may be made therein without departing from the spirit and scope of the invention as defined by the appended claims.

What is claimed is:
1. A conductive film, comprising:
    a substrate;
    a first conductive layer formed on the substrate; and
    a patterned second conductive layer ($M^1$) formed on the first conductive layer,
    wherein oxide layers (($M^2)_xO_y$) are formed on top and side surfaces of the second conductive layer ($M^1$),
    wherein $M^1$ includes copper (Cu), aluminum (Al), molybdenum (Mb), chromium (Cr), magnesium (Mg), calcium (Ca), sodium (Na), potassium (K), titanium (Ti), indium (In), yttrium (Y), lithium (Li), gadolinium (Gd), silver (Ag), tin (Sn), lead (Pb) or an alloy containing two or more thereof, $M^1$ and $M^2$ are the same with each other, x is a number from 1 to 3, and y is a number from 1 to 4.

2. The conductive film according to claim 1, wherein the substrate includes one or more resins selected from the group consisting of polyesters, acetates, polyether sulfones, polycarbonates, polyamides, polyimides, (meth)acrylates, polyvinyl chlorides, polyvinylidene chlorides, polystyrenes, polyvinyl alcohols, polyacrylates and polyphenylene sulfides.

3. The conductive film according to claim 1, wherein the first conductive layer is formed of ITO or a zinc oxide-based thin film doped with an element M (ZnO:M), and the element M is a group 13 element or a transition metal having an oxidation number of +3.

4. The conductive film according to claim 1, further comprising a protective layer formed on the second conductive layer having an oxide layer.

5. The conductive film according to claim 4, wherein the protective layer includes a least one of ITO, IZO and a metal.

6. The conductive film according to claim 1, wherein the second conductive layer has a thickness of 1 nm to 1 mm.

7. The conductive film according to claim 1, wherein the second conductive layer has a patterned structure, in which a width of a pattern is 50 nm to 2 μm, and a distance between patterns is 50 μm to 5 mm.

8. The conductive film according to claim 1, wherein the oxide layer formed on the second conductive layer includes $Cu_2O$.

9. The conductive film according to claim 1, wherein the oxide layer formed on the second conductive layer has a thickness of 1 to 100 nm.

10. A display device comprising a conductive film according to claim 1.

11. A lighting apparatus comprising a conductive film according to claim 1.

12. A method of manufacturing a conductive film, comprising:

forming a first conductive layer and a second conductive layer ($M^1$) on a substrate; and forming a patterned second conductive layer ($M^1$) having oxide layers ($(M^2)_xO_y$) on top and side surfaces thereof by thermal or plasma treatment, wherein $M^1$ includes copper (Cu), aluminum (Al), molybdenum (Mb), chromium (Cr), magnesium (Mg), calcium (Ca), sodium (Na), potassium (K), titanium (Ti), indium (In), yttrium (Y), lithium (Li), gadolinium (Gd), silver (Ag), tin (Sn), lead (Pb) or an alloy containing two or more thereof, $M^1$ and $M^2$ are the same with each other, x is a number from 1 to 3 , and y is a number from 1 to 4.

13. The method according to claim 12, comprising:

forming first and second conductive layers on a substrate;

forming an oxide layer on a surface of the second conductive layer;

patterning the second conductive layer having the oxide layer; and forming an oxide layer on a side surface of the patterned second conductive layer.

14. The method according to claim 12, comprising:

forming first and second conductive layers on a substrate;

patterning the second conductive layer; and forming oxide layers on top and side surfaces of the patterned second conductive layer.

15. The method according to claim 12, wherein the forming of the first and second conductive layers on the substrate is performed by thermal deposition, vacuum deposition, sputtering, electron beam deposition or ion beam deposition.

16. The method according to claim 12, wherein the thermal treatment is performed at a temperature of 130 to 200 ° C.

* * * * *